ized to form multiple semiconductor devices (89), each device (89) including the microelectronic device (26) covered by a section of the cap wafer (60) and terminal elements (28, 30) exposed from the cap wafer (60).

(12) United States Patent
Karlin et al.

(10) Patent No.: US 9,061,885 B2
(45) Date of Patent: Jun. 23, 2015

(54) CAVITY BASED PACKAGING FOR MEMS DEVICES

(71) Applicants: Lisa H. Karlin, Chandler, AZ (US); Lianjun Liu, Chandler, AZ (US); Alex P. Pamatat, Austin, TX (US); Paul M. Winebarger, Austin, TX (US)

(72) Inventors: Lisa H. Karlin, Chandler, AZ (US); Lianjun Liu, Chandler, AZ (US); Alex P. Pamatat, Austin, TX (US); Paul M. Winebarger, Austin, TX (US)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 0 days.

(21) Appl. No.: 14/018,091

(22) Filed: Sep. 4, 2013

(65) Prior Publication Data
US 2014/0008739 A1 Jan. 9, 2014

Related U.S. Application Data

(62) Division of application No. 12/722,225, filed on Mar. 11, 2010.

(51) Int. Cl.
*H01L 33/48* (2010.01)
*H01L 33/62* (2010.01)
*B81B 3/00* (2006.01)
*B81B 7/00* (2006.01)
*H01L 21/50* (2006.01)
(Continued)

(52) U.S. Cl.
CPC .............. *B81B 3/0018* (2013.01); *B81B 7/007* (2013.01); *H01L 21/50* (2013.01); *H01L 21/78* (2013.01); *H01L 23/04* (2013.01); *H01L 24/94* (2013.01); *H01L 24/97* (2013.01); *H01L 2924/1461* (2013.01)

(58) Field of Classification Search
CPC ............ B81B 7/007; B81C 2203/0118; H01L 2924/1461; H01L 2924/161; H01L 24/94; H01L 24/97

USPC ................. 438/15, 25–26, 51, 55, 64, 67–68, 438/106–115, 118–119; 257/698, 730, 733, 257/E23.003, E23.01, E23.023–E23.024, 257/E23.043, E23.141
See application file for complete search history.

(56) References Cited

U.S. PATENT DOCUMENTS 6,011,304 A * 1/2000 Mertol ........................ 257/706
6,106,735 A   8/2000 Kurle et al.
(Continued)

OTHER PUBLICATIONS

PCT/US2011/023993 International Search Report and Written Opinion mailed Sep. 30, 2011.

*Primary Examiner* — Laura Menz
*Assistant Examiner* — Maliheh Malek
(74) *Attorney, Agent, or Firm* — Charlene R. Jacobsen

(57) ABSTRACT

A wafer structure (88) includes a device wafer (20) and a cap wafer (60). Semiconductor dies (22) on the device wafer (20) each include a microelectronic device (26) and terminal elements (28, 30). Barriers (36, 52) are positioned in inactive regions (32, 50) of the device wafer (20). The cap wafer (60) is coupled to the device wafer (20) and covers the semiconductor dies (22). Portions (72) of the cap wafer (60) are removed to expose the terminal elements (28, 30). The barriers (36, 52) may be taller than the elements (28, 30) and function to prevent the portions (72) from contacting the terminal elements (28, 30) when the portions (72) are removed. The wafer structure (88) is singulated to form multiple semiconductor devices (89), each device (89) including the microelectronic device (26) covered by a section of the cap wafer (60) and terminal elements (28, 30) exposed from the cap wafer (60).

8 Claims, 6 Drawing Sheets

(51) Int. Cl.
  *H01L 21/78* (2006.01)
  *H01L 23/04* (2006.01)
  *H01L 33/54* (2010.01)
  *H01L 23/00* (2006.01)

(56) References Cited

U.S. PATENT DOCUMENTS

| | | | |
|---|---|---|---|
| 6,384,472 B1 * | 5/2002 | Huang | 257/680 |
| 6,461,893 B2 * | 10/2002 | Hyoudo et al. | 438/106 |
| 6,462,401 B2 | 10/2002 | Fujii | |
| 6,590,269 B1 * | 7/2003 | Chuang et al. | 257/432 |
| 6,759,307 B1 | 7/2004 | Yang | |
| 6,777,263 B1 | 8/2004 | Gan et al. | |
| 6,787,897 B2 | 9/2004 | Geefay et al. | |
| 6,989,296 B2 * | 1/2006 | Huang et al. | 438/127 |
| 7,250,353 B2 | 7/2007 | Nasiri et al. | |
| 7,273,765 B2 * | 9/2007 | Minamio et al. | 438/68 |
| 7,378,724 B2 * | 5/2008 | Yu et al. | 257/685 |
| 7,466,018 B2 | 12/2008 | Kocian et al. | |
| 7,485,496 B2 * | 2/2009 | Chien et al. | 438/122 |
| 7,550,778 B2 | 6/2009 | Thompson et al. | |
| 7,557,441 B2 | 7/2009 | Pyo et al. | |
| 7,569,926 B2 | 8/2009 | Carlson et al. | |
| 7,615,394 B2 | 11/2009 | Kim et al. | |
| 7,682,934 B2 | 3/2010 | Chen et al. | |
| 7,816,771 B2 | 10/2010 | Shen et al. | |
| 7,948,043 B2 | 5/2011 | Kim et al. | |
| 7,960,208 B2 | 6/2011 | Carlson et al. | |
| 8,088,651 B1 | 1/2012 | Thompson et al. | |
| 2002/0070440 A1 | 6/2002 | Aiba et al. | |
| 2002/0094662 A1 | 7/2002 | Felton et al. | |
| 2002/0190266 A1 * | 12/2002 | Kanatake | 257/112 |
| 2003/0118277 A1 | 6/2003 | Yu et al. | |
| 2004/0067604 A1 * | 4/2004 | Ouellet et al. | 438/108 |
| 2005/0176166 A1 * | 8/2005 | Chen et al. | 438/51 |
| 2006/0057836 A1 | 3/2006 | Nagarajan et al. | |
| 2006/0160273 A1 * | 7/2006 | Chen | 438/113 |
| 2006/0278992 A1 | 12/2006 | Trezza et al. | |
| 2006/0292724 A1 * | 12/2006 | Nakamura | 438/29 |
| 2007/0161158 A1 * | 7/2007 | Shao et al. | 438/125 |
| 2007/0161210 A1 | 7/2007 | Shao et al. | |
| 2007/0190747 A1 | 8/2007 | Humpston et al. | |
| 2007/0218584 A1 | 9/2007 | Chen et al. | |
| 2008/0014682 A1 | 1/2008 | Yang et al. | |
| 2008/0237892 A1 * | 10/2008 | Saeki | 257/778 |
| 2009/0026558 A1 * | 1/2009 | Bauer et al. | 257/414 |
| 2009/0029500 A1 * | 1/2009 | Wan | 438/51 |
| 2009/0194850 A1 * | 8/2009 | Kaltalioglu et al. | 257/620 |
| 2009/0194852 A1 * | 8/2009 | Chiu et al. | 257/660 |
| 2009/0321867 A1 | 12/2009 | Leib et al. | |
| 2010/0003772 A1 * | 1/2010 | Carlson et al. | 438/18 |
| 2010/0072578 A1 * | 3/2010 | Kunishima | 257/620 |
| 2010/0244159 A1 * | 9/2010 | Karlin et al. | 257/415 |
| 2011/0024923 A1 | 2/2011 | Foster et al. | |
| 2011/0147932 A1 | 6/2011 | Trezza et al. | |
| 2012/0012963 A1 * | 1/2012 | Zhang et al. | 257/434 |

* cited by examiner

US 9,061,885 B2

CAVITY BASED PACKAGING FOR MEMS DEVICES

TECHNICAL FIELD OF THE INVENTION

The present invention relates generally to semiconductor wafer processing. More specifically, the present invention relates to a semiconductor device and method of fabrication that limits damage to elements of the semiconductor device that are exposed during processing.

BACKGROUND OF THE INVENTION

Microelectromechanical systems (MEMS) technology is increasingly being implemented for providing many products, such as inertial sensors, accelerometers for measuring linear acceleration, gyroscopes for measuring angular velocity, optical devices, pressure sensors, switches, and so forth. A MEMS device typically includes a moveable element, such as a proof mass, diaphragm, mirror, and the like that is flexible or movable, and is attached to the rest of the device. Relative motion between this movable element and the rest of the device is driven by actuators and/or sensed by sensors in various ways, depending on device design.

Semiconductor processing, used for fabricating MEMS devices, generally comprises multiple photolithographic, etching, depositing, and doping operations to form an array of individual MEMS devices on the surface of a semiconductor substrate, such as a wafer. Semiconductor processing for MEMS devices, typically entails one of bulk- and surface-micromachining. In bulk-micromachining, MEMS features are created by selectively removing silicon to form the desired structures. In surface micromachining, an additive process is performed using polysilicon layers and/or metal layers on top of sacrificial oxides and then removing the sacrificial layers to create the MEMS devices. Each MEMS device is separated from the others by a narrow inactive, i.e., unused, region on the device wafer referred to as a die "street". Following micromachining and wafer level testing, individual MEMS devices are "singulated." Singulation is typically accomplished by sawing or cutting along scribe lines in the die streets to produce singulated semiconductor dies.

Most MEMS devices require terminal elements, in the form of electrical inputs and outputs, to perform their design functions. Traditionally, MEMS devices require custom cavity based packaging to both provide access to the input/output elements and to protect the MEMS features, which are generally very fragile and sensitive to dust, particles, and moisture. The packaging for a MEMS device can entail a protective cover over the sensitive MEMS features that will allow the part to be handled by standard assembly and packaging means. One conventional method has been to have pre-fabricated individual covers that are picked and placed over the sensitive MEMS features by automated means prior to dicing the MEMS device wafers. Another packaging method is to provide for protective covers by etching cavities in a silicon cap wafer and affixing it to the MEMS device wafer by various means, such as solder, glass frits, adhesives, and so forth.

A challenge faced in performing any of the protective capping techniques has been to allow for ready access to the terminal elements. In MEMS wafer processing, a release step may be performed that exposes the terminal elements in order to make them accessible. The release step may be performed by etching or sawing a portion of the cover or cap wafer that is not protecting the MEMS device but is obscuring access to the terminal elements. Unfortunately, such release methods can generate debris that can damage the terminal elements.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Embodiments of the invention entail a semiconductor device and a method of fabricating the semiconductor device in which portions of a cap wafer are removed to expose particular features of the underlying semiconductor dies, such as the electrical input and output elements. Appropriate structure and methodology is implemented that largely protects the particular input/output elements as they are exposed. The semiconductor device and corresponding methodology are cost-effective, readily implemented, and adaptable to existing assembly and packaging tools and techniques.

FIGS. 1-10 are illustrated using various shading and/or hatching to distinguish the different elements produced within the structural layers of a device wafer and cap wafer that form a wafer structure, as will be discussed below. These different elements may be produced utilizing current and upcoming micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

Figure 1:
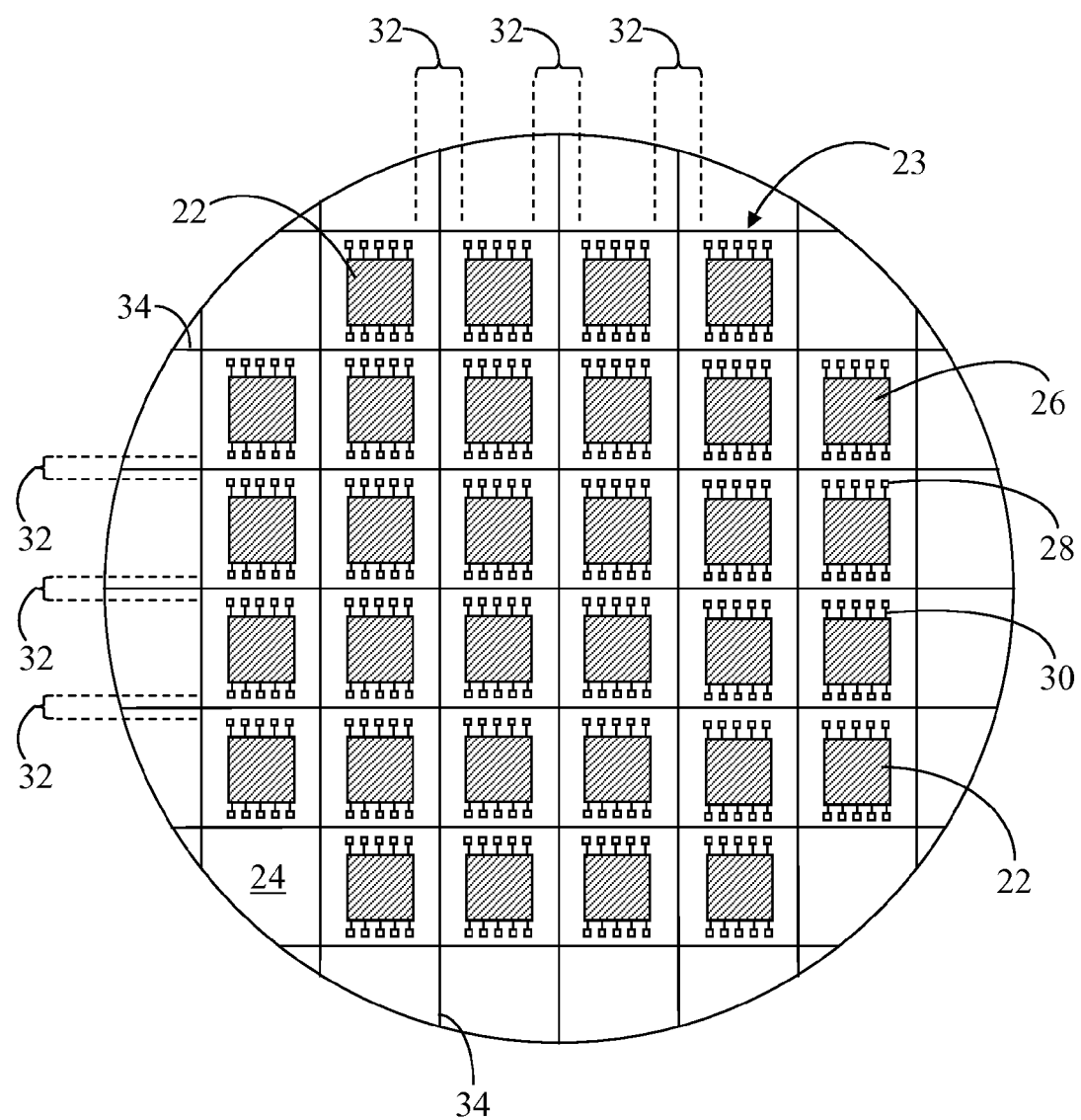
FIG. 1 shows a top view of a device wafer having individual semiconductor dies formed thereon.

FIG. 1 shows a top view of a device wafer 20 having individual semiconductor dies 22 on a side 23 of device wafer 20. In an embodiment, each of semiconductor dies 22 includes a microelectronic device 26 at least partially surrounded by terminal elements. Microelectronic devices 26 may embodied as microelectromechanical systems (MEMS) devices such as inertial sensors, gyroscopes, optical devices, pressure sensors, switches, microphones, and so forth. Thus, for simplicity microelectronic devices 26 are referred to hereinafter as MEMS devices 26. However, in alternative embodiments, microelectronic devices 26 may be any other device in which it is desirable to individually protect, i.e., cap, sensitive features and additionally expose or reveal terminal elements (inputs and outputs) at the wafer level. The quantity of semiconductor dies 22 formed on a given device wafer 20 varies depending upon size of MEMS devices 26 and upon the size of device wafer 20.

The terminal elements are those features coming from MEMS devices 26 that end on a surface 24 of device wafer 20 and provide a point of connection to external devices. Thus, the terminal elements illustrated herein are in the form of bond pads 28 and conductive lines 30. Conductive lines 30, also referred to as traces or runners, electrically interconnect bond pads 28 with a corresponding one of MEMS devices 26. Deposited conductive elements, e.g., bond pads 28 and conductive lines 30, provide the functions of surface wiring and bonding, electrical contacts, fuses, and so forth. Bond pads 28 and conductive lines 30 are preferably formed of an electrically conductive material, such as metal, or polysilicon (hereafter poly).

Bond pads 28 and conductive lines 30 are arranged proximate two sides of each MEMS device 26. However, in alternative embodiments, bond pads 28 and conductive lines 30 may be arranged about the entire perimeter of each MEMS device 26, or about any number of the sides of each MEMS device 26. In addition, each MEMS device 26 is represented by a single component. In alternative embodiments, each semiconductor die 22 may include two or more separate devices in which distinct subsets of bond pads 28 are electrically connected to a particular one of the two or more separate devices.

MEMS devices 26 are separated from one another by a narrow inactive, or unused, region 32 of device wafer 20, typically referred to as a die "street." Following micromachining and wafer level testing, individual semiconductor dies 22 are "singulated" by sawing or etching along scribe lines 34 in inactive regions 32 to produce singulated semiconductor dies 22.

Multiple MEMS devices 26, bond pads 28, and conductive lines 30 of semiconductor dies 22 are formed simultaneously on device wafer 20 as wafer 20 undergoes wafer-level processing. Wafer-level processing entails operations in which circuit patterns are formed on device wafer 20 through exposing and patterning structural layers by, for example, photolithography. Following the formation of multiple semiconductor dies 22 and prior to singulation, a cap wafer (discussed below) may be coupled to device wafer 20 to protect the sensitive features of MEMS devices 26. However, various portions of the cap wafer are typically removed in a release process by etching or sawing in order to appropriately expose the terminal elements (i.e., bond pads 28 and at least a portion of conductive lines 30) for subsequent inspection, wafer-level testing, and so forth. A concern in exposing bond pads 28 and conductive lines 30 in a release process is to protect them from damage during the release process. Damage to the bond pads 28 and/or conductive lines 30 leads to unacceptably high quantities of defective semiconductor dies 22 on device wafer 20.

Figure 2:
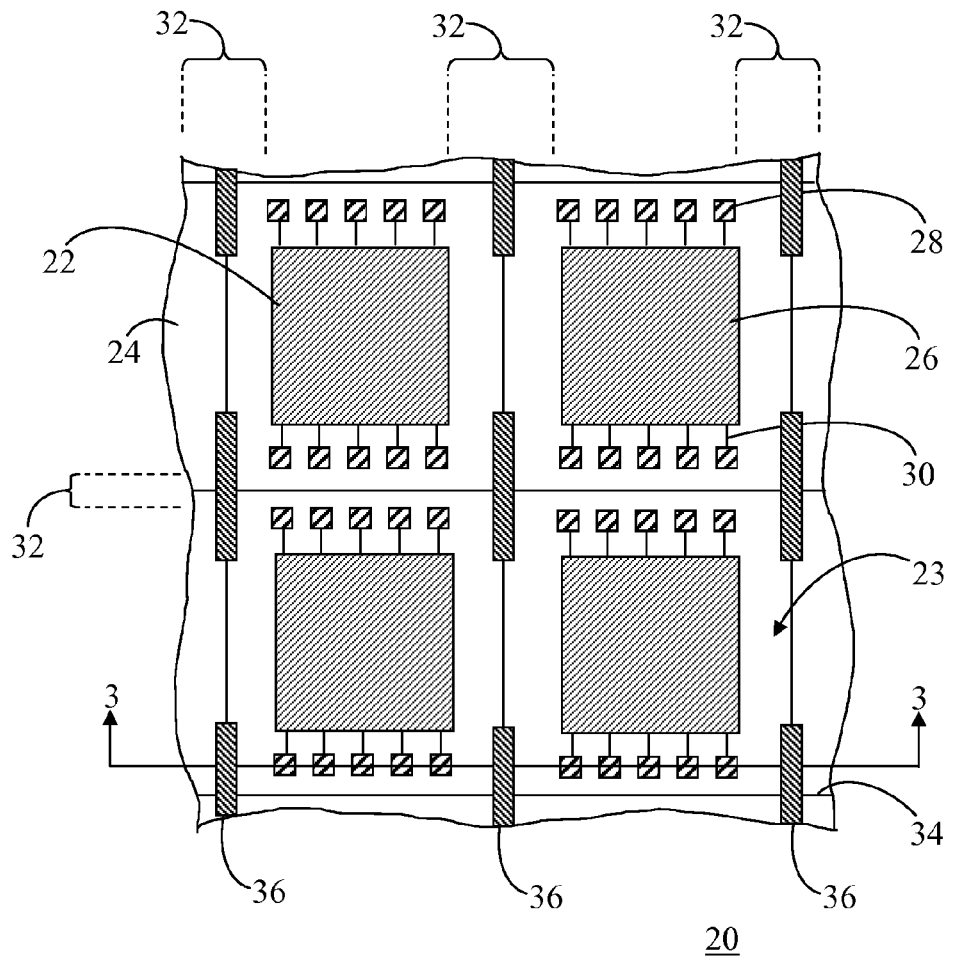
FIG. 2 shows an enlarged top view of a portion of the device wafer of FIG. 1.
Figure 3:
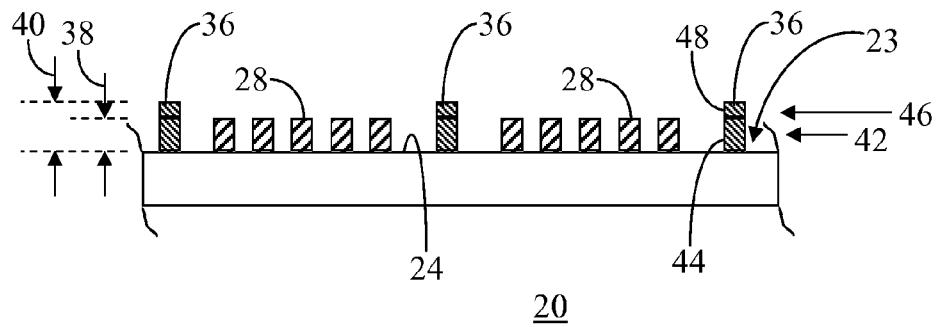
FIG. 3 shows a side view of the portion of the device wafer along section line 3-3 of FIG. 2.

Referring to FIGS. 2 and 3, FIG. 2 shows an enlarged top view of a portion of device wafer 20, and FIG. 3 shows a side view of the portion of device wafer 20 along section line 3-3 of FIG. 2. In accordance with an embodiment, barriers 36 are positioned in inactive regions 32 of device wafer 20. In this illustration, inactive region 32 is the area between adjacent semiconductor dies 22 prior to singulation. Accordingly, inactive regions 32 separate and electrically isolate terminal elements of one of semiconductor dies 22, e.g., bond pads 28, from terminal elements of adjacent semiconductor dies 22, e.g., bond pads 28. In this illustration, barriers 36 are positioned in inactive regions 32 overlying the vertically oriented scribe lines 34 (see FIG. 1). However, in alternative embodiments, barriers 36 may be offset from these scribe lines 34 to facilitate singulation. In addition, distinct barriers 36 are illustrated as extending only beside bond pads 28 and conductive lines 30. In alternative embodiments, barriers 36 may extend longer or shorter than that which is shown.

Particularly illustrated in FIG. 3, bond pads 28 extend above surface 24 of device wafer 20 at a height 38. Barriers 36 may extend above surface 24 of device wafer 20 at a height 40, which is greater than height 38 of bond pads 28. In some embodiments, height 40 of barriers 36 may be fifty percent greater than height 38 of bond pads 28. As will become apparent in the ensuing discussion, barriers 36 function to substantially block debris formed during a release process from coming into contact with the terminal elements, i.e., bond pads 28 and/or conductive lines 30.

In an embodiment, barriers 36 may be formed on surface 24 during deposition, patterning, and etching of structural layers. In this example, bond pads 28, conductive lines 30, and at least a portion of MEMS device 26 may be formed in a first structural layer 42, e.g., polysilicon, on surface 24 of device wafer 20 in accordance with conventional deposition and structuring operations. In addition, a first layer 44 of each of barriers 36 is also formed in this first structural layer 42 during these same deposition and structuring operations. Subsequent deposition of a second structural layer 46, e.g., a second layer of polysilicon, and structuring operations are performed to form a second layer 48 of each of barriers 36. Thus, height 38 of bond pads 28 and conductive lines 30 corresponds to the depth of first structural layer 42 and height 40 of barriers 36 corresponds to the depth of both first and second structural layers 42 and 46.

Of course, in conjunction with the elements of semiconductor dies 22 being formed in first and second structural layers 42 and 46, those skilled in the art will recognize that additional structural layers and/or sacrificial layers (not shown) may be used to build semiconductors dies 22. For example, MEMS devices 26 may include movable parts which can be built by depositing and structuring one or more sacrificial layers, which can be selectively removed at the locations where the anchors for the movable parts are to be attached to device wafer 20. The structural layer, e.g., first and/or second structural layers 42 and 46, can then be deposited on top of the sacrificial layer and structured to define the movable parts of MEMS devices 26. The sacrificial layer is eventually removed to release the movable parts of MEMS devices 26, using a selective etch process that will not damage first and second structural layers 42 and 44, and thus will not damage bond pads 28, conductive lines 30, and barriers 36. In addition, barriers 36 may further include another polysilicon, metal, nitride, or any other non-sacrificial layer to achieve the desired height 40.

Figure 4:
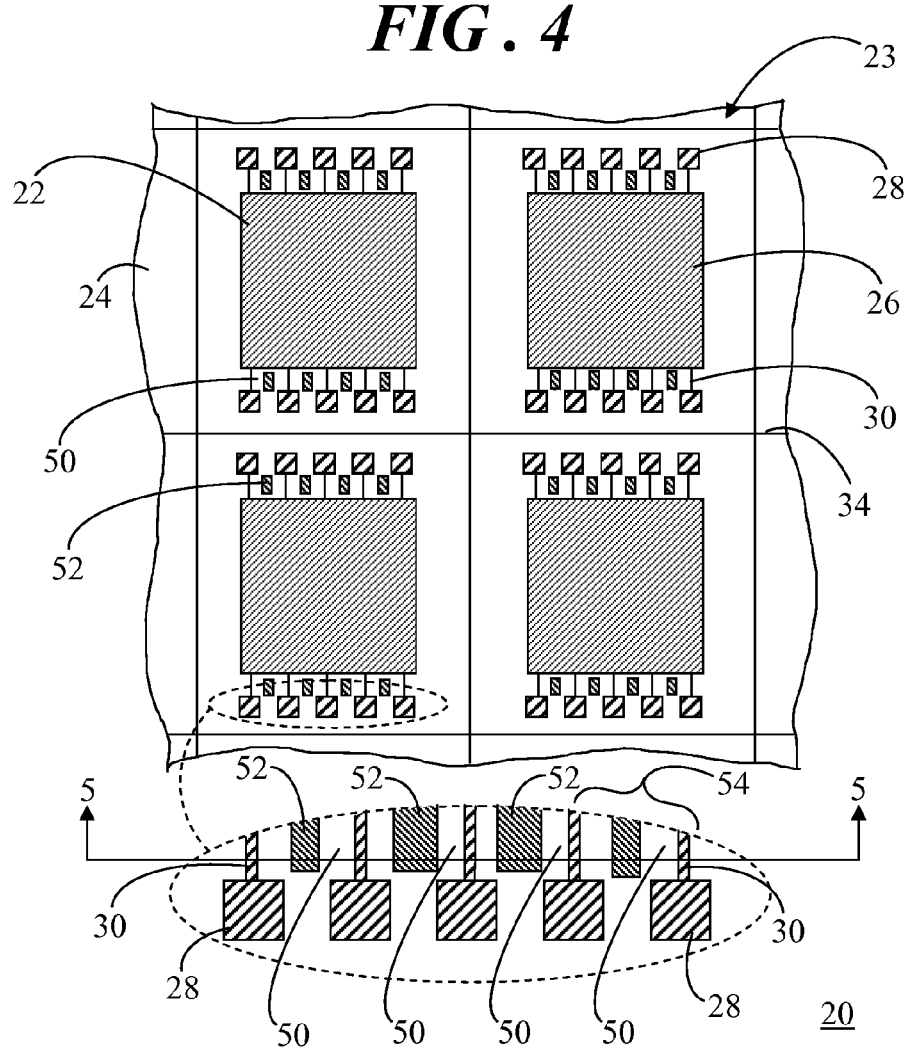
FIG. 4 shows an enlarged top view of a portion of the device wafer of FIG. 1 in accordance with another embodiment of the invention.
Figure 5:
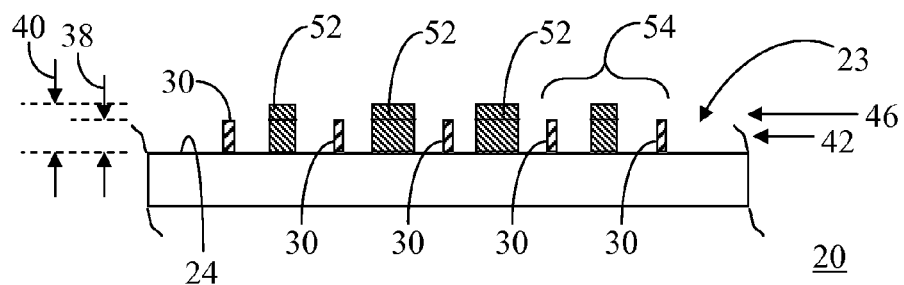
FIG. 5 shows a side view of the portion of the device wafer along section line 5-5 of FIG. 4.

Referring to FIGS. 4-5, FIG. 4 shows an enlarged top view of a portion of device wafer 20 of FIG. 1 in accordance with another embodiment. FIG. 4 additionally shows a greatly enlarged view of bond pads 28 and conductive lines 30. FIG. 5 shows a side view of the portion of the device wafer 20 along section lines 5-5 of FIG. 4.

In accordance with this illustrative embodiment, multiple inactive regions 50 are located between pairs of conductive lines 30. Inactive regions 50 separate and electrically isolate elements of one semiconductor die 22, e.g., conductive lines 30, from elements of the same semiconductor die 22, e.g., adjacent conductive lines 30. Barriers 52 are positioned in these inactive regions 50 of device wafer 20. Thus, barriers 52 are positioned between adjacent pairs 54 of the multiple conductive lines 30. Again, barriers 52 extend above surface 24 of device wafer 20 at height 40, which is greater than height 38 of bond pads 28 and conductive lines 30.

FIGS. 2-5 illustrate various inactive regions, i.e., unused areas, on surface 24 of device wafer 22 at which barriers may be positioned for the purpose of blocking debris generated by a sawing or etching operation (discussed below) from damaging nearby terminal elements, e.g., bond pads 28 and/or conductive lines 30. It should be understood that other unused locations on surface 24 may additionally or alternately be selected at which barriers may be positioned.

Figure 6:
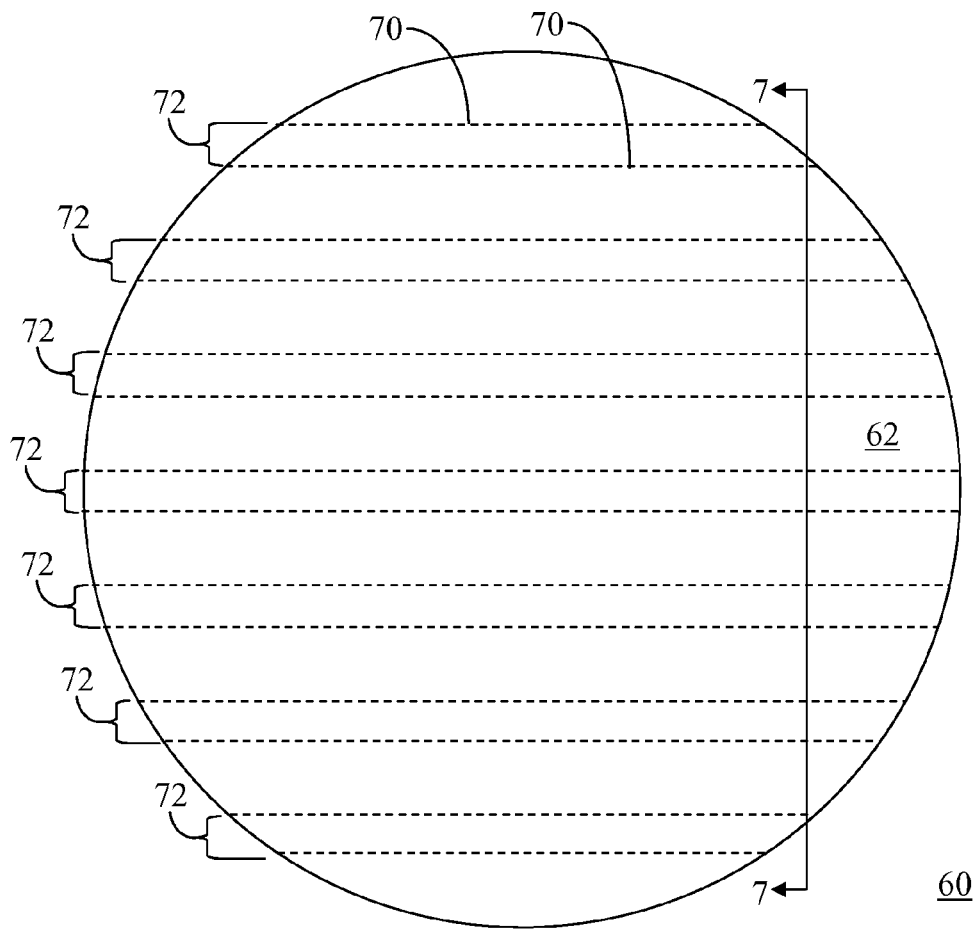
FIG. 6 shows a top view of a cap wafer used as a cover for the device wafer.
Figure 7:
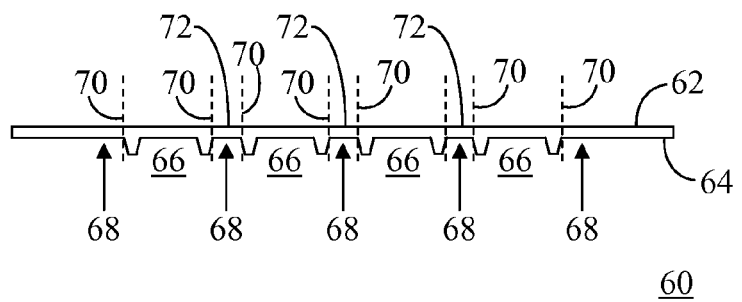
FIG. 7 shows a side view of the cap wafer along section line 7-7 of FIG. 6.

Referring to FIGS. 6 and 7, FIG. 6 shows a top view of a cap wafer 60 used as a cover for device wafer 20 (FIG. 1), and FIG. 7 shows a side view of cap wafer 60 along section lines 7-7 of FIG. 6. In the illustrative embodiment, cap wafer 60 includes an outer surface 62 and an inner surface 64. Cavities 66 and 68 are formed in inner surface 64 of cap wafer 60. During assembly, cap wafer 60 is coupled to device wafer 20 (FIG. 1) by various means, such as solder, glass frits, adhesives, and so forth. Once they are coupled together, MEMS devices 26 (FIG. 2) are located in cavities 66 and bond pads 28 and conductive lines 30 are located in cavities 68.

Outer surface 62 of cap wafer 60 is marked with scribe lines or saw lines 70 along the generally planar outer surface 62 of cap wafer 60, as shown in FIG. 6. In an embodiment, following the coupling of cap wafer 60 to device wafer 20, cap wafer 60 is sawn or etched along saw lines 70 in a release operation in order to remove a portion 72 of cap wafer 60 positioned between pairs of saw lines 70. Saw lines 70 are represented in a vertical direction in FIG. 7 to demonstrate that those portions 72 of cap wafer 60 overlying cavities 68 are removed in order to access bond pads 28.

Portion 72 of cap wafer 60 is removed to expose the underlying elements on device wafer 20, namely bond pads 28 and conductive lines 30. However, it is this portion 72 of cap wafer 60 that may be ejected from the wafer or a saw blade when cap wafer 60 is sawn to reveal the underlying elements. Portion 72, in the form of slivers, can scratch or abrade bond pads 28 and conductive lines 30 during the saw to reveal operation. However, the presence of barriers 36 (FIG. 2) and/or barriers 52 (FIG. 4) largely blocks the slivers of portion 72 from coming into contact with the sensitive terminal elements, i.e., bond pads 28 and conductive lines 30, during this release operation.

Figure 8:
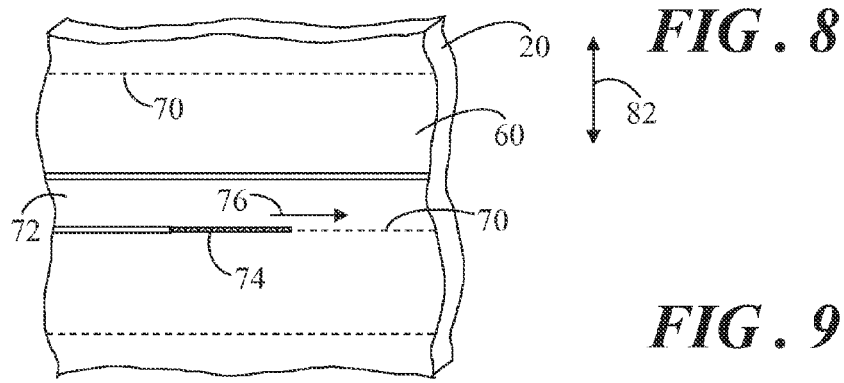
FIG. 8 shows a top view of a portion of the cap wafer of FIG. 6 coupled with the underlying device wafer of FIG. 1.
Figure 9:
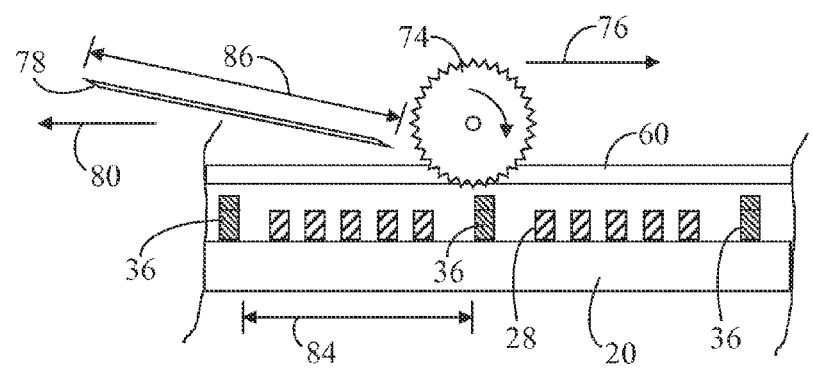
FIG. 9 shows a partial side view of a portion of the cap wafer being removed by sawing.

Referring to FIGS. 8 and 9, FIG. 8 shows a top view of a portion of cap wafer 60 coupled with the underlying device wafer 20, and FIG. 9 shows a partial side view of portion 72 of cap wafer 60 being removed by sawing. A saw blade 74 is directed in a direction 76 that is generally parallel to the surfaces of device wafer 20 and cap wafer 60, and saws through cap wafer 60 along saw lines 70. Accordingly, saw blade 74 throws or ejects debris from sawing, i.e., slivers 78 of portion 72, in a direction 80 opposite that of movement direction 76. Alternatively, or in addition, slivers 78 may be ejected in varying directions when, for example, saw blade 74 is configured to rotate in both directions.

Device wafer 20 includes barriers 36 between adjacent semiconductor dies 22 (FIG. 2). Device wafer 20 may also include barriers 52 (FIG. 4) between adjacent conductive lines 30. As shown, barriers 36 are lengthwise oriented on surface 24 of device wafer in a direction 82 (visible in FIG. 10) that is generally perpendicular to direction 80. In other words, the length of barriers 36 is arranged generally parallel to direction 82. Thus, slivers 78 of portion 72 are likely to hit and be deflected away by barriers 36 as they are thrown from saw blade 74 in direction 80. This limits the probably of contact between slivers 78 and bond pads 28 or conductive lines 30.

Furthermore, barriers 36 may be formed such that they are separated from one another by a distance 84 that is less than the length 86 of a typical sliver 78. Accordingly, should any of slivers 78 fall into the opening formed in cap wafer 60 between saw lines 70, slivers 78 are likely to land across a pair of barriers 36 without coming into contact with the lower profile bond pads 28 and conductive lines 30. As such, barriers 36 and barriers 52 perform a shielding function to protect the terminal elements, e.g., bond pads 28 and conductive lines 30, from damage when portion 72 of cap wafer 60 is removed to expose bond pads 28 and conductive lines 30.

Figure 10:
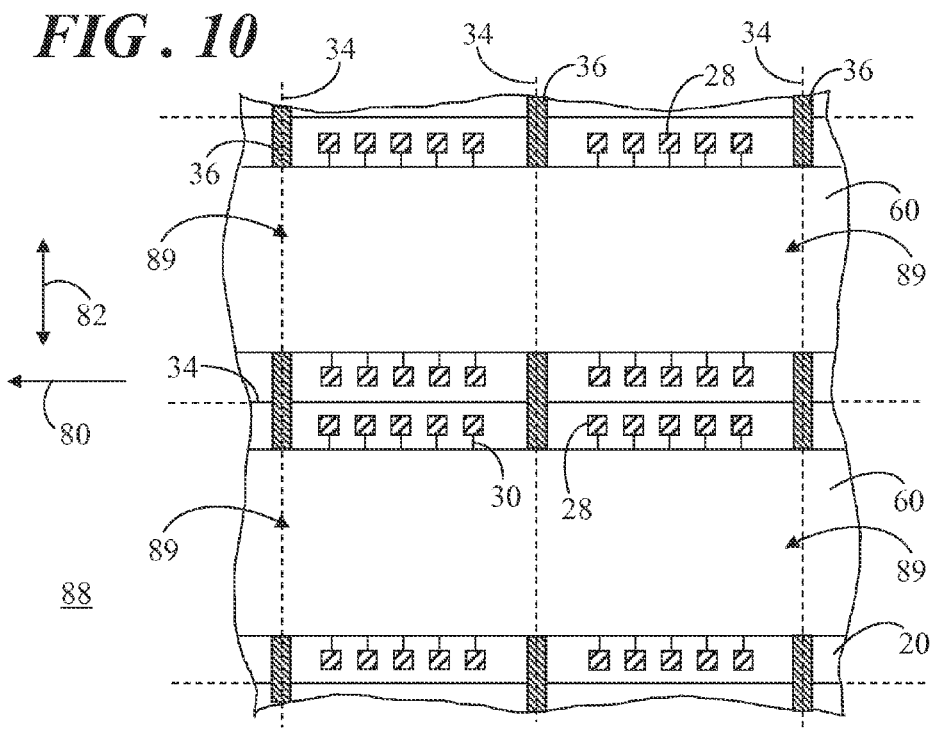
FIG. 10 shows a top view of a portion of a wafer structure following sawing to expose bond pads and conductive lines.

FIG. 10 shows a top view of a portion of a wafer structure 88 following sawing to expose bond pads 28 and at least a portion of conductive lines 30. As shown, cap wafer 60 covers MEMS devices 26 (FIG. 1) which are therefore not visible. However, bond pads 28 are exposed so that semiconductor dies 22 formed on device wafer 20 of wafer structure 88 can undergo inspection, electrical testing at the wafer level, and so forth. Wafer structure 88 is sawn or etched along scribe lines 34 to form singulated semiconductor devices 89, delineated in FIG. 10 by scribe lines 34. Each of the singulated semiconductor devices 89 thus includes a portion of device wafer 20 having the appropriate elements formed thereon and a portion of cap wafer 60 overlying certain areas of device wafer 20 in accordance with the particular design.

Figure 11:
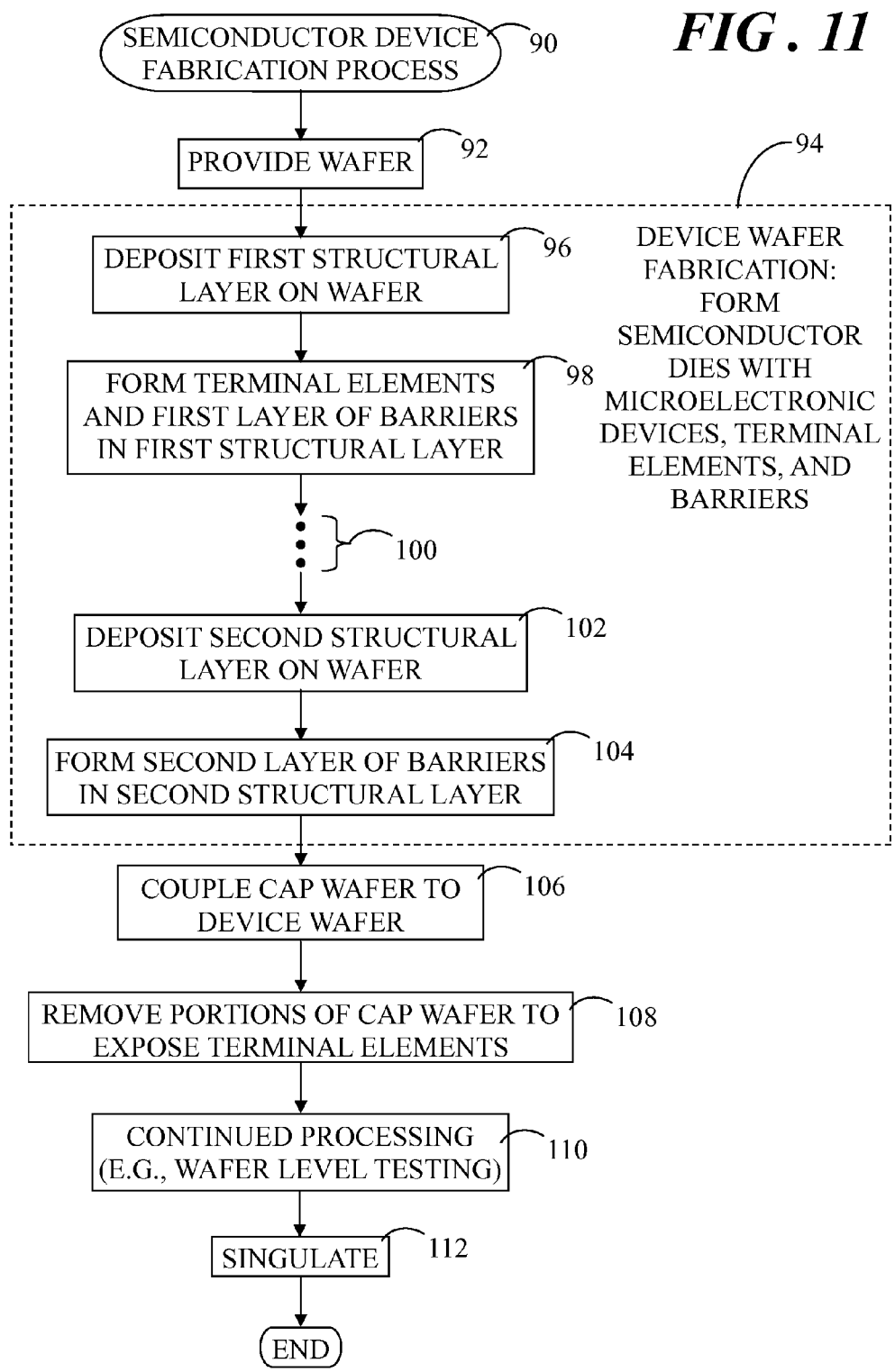
FIG. 11 shows a flowchart of a semiconductor device fabrication process summarizing the fabrication of the wafer structure of FIG. 10.

FIG. 11 shows a flowchart of a semiconductor device fabrication process 90 summarizing the fabrication of semiconductor devices (FIG. 10). Fabrication process 90 provides protection to an underlying device wafer 20 (FIG. 1) during a release process that exposes particular features of semiconductor dies 22 (FIG. 1) formed on device wafer 20. In this exemplary description, a surface-micromachining process is generally described. However, principles of the invention may be adapted to incorporate barriers 36 and/or barriers 52 using, for example, bulk-micromachining techniques.

Process 90 generally commences with a task 92. At task 92, a wafer is provided from a provider or manufacturer in accordance with conventional processes.

Next, a device wafer fabrication subprocess 94 is performed to form semiconductor dies 22 (FIG. 1) with MEMS devices 26 (FIG. 2), bond pads 28 (FIG. 2), conductive lines 30 (FIG. 2), and barriers 36 (FIG. 2) and/or barriers 52 (FIG. 4) on surface 24 (FIG. 1) of device wafer 20. Thus, following task 92, a task 96 of subprocess 94 entails the deposition of first structural layer 42 (FIG. 3) on surface 24 of device wafer 20.

Process 90 continues with a task 98. At task 98, first structural layer 42 is structured to form the terminal elements (i.e. bond pads 28 and conductive lines 30), first layer 44 (FIG. 3) of barriers 36 and/or barriers 52, and any additional elements of MEMS devices 26. Thus, following task 98, bond pads 28, conductive lines 30, and first layer 44 are formed each of which are height 38 (FIG. 3) above surface 24 of device wafer 20.

Fabrication process 90 includes ellipses 100 following task 98 that indicate an intentional omission of tasks for brevity of discussion. These tasks are not directly related to the fabrication of barriers 36 and/or barriers 52, but may be carried out in accordance with design features for semiconductor dies 22. For example, these omitted tasks may include deposition, patterning, and etching of a sacrificial layer in order to form the movable part or parts of MEMS devices 26 on device wafer 20.

Following these omitted operations, fabrication processes continues with a task 102. At task 102, second structural layer 46 (FIG. 3) is deposited on device wafer 20, including deposition over first layer 42 of barriers 36 and/or barriers 52.

Device wafer fabrication subprocess 94 continues with a task 104. At task 104, second structural layer 46 is suitably patterned and etched to form at least second layer 48 (FIG. 3) of barriers 36 and/or barriers 52. Of course, second structural layer 46 may also be suitably patterned and etched to form any other design features of MEMS devices 26 (FIG. 1). Thus, following task 104, barriers 36 and/or barriers 52 are height 40 (FIG. 3) above surface 24 of device wafer 20. Following task 104, additional operations may be performed per convention to finalize fabrication of device wafer 20.

MEMS structure fabrication process 90 continues with a task 106. At task 106, cap wafer 60 (FIG. 6) is coupled to device wafer 20 per conventional means, such as solder, glass fits, adhesives, and so forth.

Following task 106, a task 108 is performed. At task 108, portions 72 (FIG. 6) of cap wafer 60 are removed to expose, i.e., reveal, the terminal elements, i.e., bond pads 28 and conductive lines 30, of the underlying semiconductor dies 22 (FIG. 1). As discussed above, portions 72 may be removed by sawing along saw lines 70 (FIG. 6) in cap wafer 60. Again, the presence of barriers 36 and/or barriers 52 positioned on the underlying device wafer 20 largely blocks slivers 78 (FIG. 9) of portion 72 of cap wafer 60 from striking bond pads 28 and conductive lines 30.

Once portions 72 of cap wafer 60 have been removed to expose, i.e., reveal, bond pads 28 and conductive lines 30, at task 108, the resulting wafer structure 88 (FIG. 10), undergoes continued processing at a task 110. This continued processing may entail visual inspection, operational testing, burn-in, stress, accelerated life testing, and so forth all while still at wafer level.

Following task 110, a task 112 is eventually performed. At task 112, the fabricated wafer structure 88 is singulated, i.e., cut or diced, in a conventional manner along scribe lines 34 (FIG. 1) to provide individual semiconductor devices 89 (FIG. 10) that can be packaged and coupled onto a printed circuit board, a ceramic substrate, and so forth in an end application.

Embodiments described herein comprise a semiconductor device and a method of fabricating the semiconductor device. The semiconductor device includes a portion of a device wafer, having semiconductor dies formed thereon, and a portion of a cap wafer coupled to and overlying the portion of the device wafer. Portions of the cap wafer are removed to expose particular terminal elements, such as bond pads and conductive lines, of the semiconductor dies. Barriers are formed concurrently with the semiconductor dies on the device wafer, and are positioned in various inactive regions of the device wafer. The barriers protect the bond pads and conductive lines from damage by slivers of the cap wafer as they are exposed in a release process. The wafer structure and corresponding methodology are cost-effective, readily implemented, and adaptable to existing assembly and packaging tools and techniques.

Although the preferred embodiments of the invention have been illustrated and described in detail, it will be readily apparent to those skilled in the art that various modifications may be made therein without departing from the spirit of the invention or from the scope of the appended claims. For example, the barriers can take on various other shapes and sizes then those which are shown, and they can be positioned at other suitable inactive regions on the device wafer.

What is claimed is:

1. A semiconductor device comprising: a device wafer portion having a first set of inactive regions and a second inactive region; a semiconductor die positioned on a side of said device wafer portion, said semiconductor die including a microelectronic device and multiple conductive lines in physical and electrical contact with said microelectronic device, wherein each inactive region of said first set of inactive regions is located between every two adjacent conductive lines of said semiconductor die; bond pads, one each of said bond pads being in electrical communication with one each of said multiple conductive lines, wherein said bond pads are adjacent to said second inactive region; a first set of barriers positioned in said first set of inactive regions by having one barrier of said first set of barriers in each of said inactive regions of said first set of inactive regions, wherein said barriers do not contact said multiple conductive lines; a second barrier positioned in said second active region; and a cap wafer section coupled to said device wafer portion and covering said microelectronic device, said cap wafer section not covering said bond pads such that said bond pads are exposed.

2. A semiconductor device as claimed in claim 1 wherein a first length of each of said barriers is aligned with a second length of each of said multiple conductive lines.

3. A semiconductor device comprising: a device wafer portion having multiple inactive regions; a semiconductor die positioned on a side of said device wafer portion, said semiconductor die including a microelectronic device and multiple conductive lines in physical and electrical contact with said microelectronic device, each of said conductive lines exhibiting a first height above a surface of said device wafer portion, wherein each of said multiple inactive regions is located between every two adjacent conductive lines of the semiconductor die; multiple barriers positioned in said multiple inactive regions by having one barrier in each of said multiple inactive regions, wherein said multiple barriers do not contact said multiple conductive lines, and each of said multiple barriers exhibits a second height above said surface of said device wafer portion, said second height being greater than said first height; and a cap wafer section coupled to said device wafer portion covering said microelectronic device.

4. A semiconductor device as claimed in claim 3 wherein a first length of each of said multiple barriers is aligned with a second length of each of said multiple conductive lines.

5. A semiconductor device as claimed in claim 3 wherein said second height is at least fifty percent greater than said first height.

6. A semiconductor device as claimed in claim 3 wherein said multiple inactive regions is a first set of inactive regions, said multiple barriers is a first set of barriers, and wherein:
said device wafer portion comprises a second inactive region; and
said semiconductor device further comprises bond pads, one each of said bond pads being in electrical communication with one each of said multiple conductive lines, wherein said bond pads are adjacent to said second inactive region, and a second barrier is positioned in said second inactive region.

7. A semiconductor device as claimed in claim 6 wherein said second barrier exhibits a third height, said third height being at least fifty percent greater than said first height.

8. A semiconductor device as claimed in claim 6 wherein said cap wafer section does not cover said bond pads such that said bond pads are exposed.

* * * * *